(12) United States Patent
Singer et al.

(10) Patent No.: US 12,707,974 B2
(45) Date of Patent: Aug. 11, 2026

(54) SEMICONDUCTOR PACKAGE WITH A SCRATCH PROTECTION LAYER AND METHOD OF FABRICATION

(71) Applicant: Infineon Technologies Austria AG, Villach (AT)

(72) Inventors: Frank Singer, Regenstauf (DE); Martin Mayer, Nittendorf (DE)

(73) Assignee: Infineon Technologies Austria AG, Villach (AT)

( * ) Notice: Subject to any disclaimer, the term of this patent is extended or adjusted under 35 U.S.C. 154(b) by 1059 days.

(21) Appl. No.: 17/734,168

(22) Filed: May 2, 2022

(65) Prior Publication Data

US 2022/0359432 A1 Nov. 10, 2022

(30) Foreign Application Priority Data

May 7, 2021 (EP) .................................... 21172812

(51) Int. Cl.
*H10W 42/00* (2026.01)
*H10W 40/25* (2026.01)
(Continued)

(52) U.S. Cl.
CPC ......... *H10W 42/00* (2026.01); *H10W 40/251* (2026.01); *H10W 74/016* (2026.01); *H10W 74/111* (2026.01); *H10W 99/00* (2026.01)

(58) Field of Classification Search
CPC . H01L 23/564; H01L 21/4803; H01L 21/565; H01L 23/3107; H01L 23/3737; H01L 23/3735; H01L 23/49562; H01L 23/4334; H01L 23/3121; H01L 23/36; H01L 24/06; H01L 24/29; H01L 24/32; H01L 2224/06181; H01L 2224/291; H01L 2224/32225; H01L 2224/32245; H01L 2224/83005; H01L 2924/1305; H01L 2924/13062; H01L 2924/1431; H01L 23/562; H01L 23/3114; H01L 21/56; H01L 2924/014; H01L 2924/00014;
(Continued)

(56) References Cited

U.S. PATENT DOCUMENTS 6,225,701 B1 * 5/2001 Hori .................. H01L 23/49568
257/E23.092
2014/0145228 A1 * 5/2014 Bohm ..................... H10F 77/42
257/432

(Continued)

FOREIGN PATENT DOCUMENTS

JP 2018065921 A 4/2018

*Primary Examiner* — Jonathan Han
(74) *Attorney, Agent, or Firm* — Murphy, Bilak & Homiller, PLLC

(57) ABSTRACT

A semiconductor package includes: a carrier having a first side and an opposing second side; a semiconductor die arranged on the first side of the carrier; a heat conductor part arranged on the second side of the carrier; an encapsulation body encapsulating the semiconductor die, wherein the heat conductor part is exposed from the encapsulation body, and wherein the heat conductor part has a different material composition than the encapsulation body; and a scratch protection layer covering the heat conductor part, wherein the scratch protection layer has a hardness which is at least five times higher than a hardness of the heat conductor part.

15 Claims, 4 Drawing Sheets

(51) Int. Cl.
*H10W 74/01* (2026.01)
*H10W 74/10* (2026.01)
*H10W 99/00* (2026.01)

(58) Field of Classification Search
CPC . H10W 42/00; H10W 40/251; H10W 74/016; H10W 74/111; H10W 99/00; H10W 42/121; H10W 40/778; H10W 40/10; H10W 40/255; H10W 70/481; H10W 72/07307; H10W 72/352; H10W 72/944; H10W 74/114; H10W 90/734; H10W 90/736; H10W 74/01; H10W 74/129
See application file for complete search history.

(56) References Cited

U.S. PATENT DOCUMENTS

2016/0141224 A1 5/2016 Yoshihara et al.
2021/0020541 A1* 1/2021 Kasztelan ........... H01L 23/3677

* cited by examiner

SEMICONDUCTOR PACKAGE WITH A SCRATCH PROTECTION LAYER AND METHOD OF FABRICATION

TECHNICAL FIELD

This disclosure relates in general to semiconductor packages, in particular to semiconductor packages with a scratch protection layer, as well as to a method for fabricating such semiconductor packages.

BACKGROUND

A semiconductor package may be a high power device which is configured to operate with a high voltage and/or a high electrical current. In particular this type of semiconductor package may require a heat dissipation scheme with a particularly low thermal resistance. Such a scheme may for example comprise transferring heat generated by a semiconductor die of the package to a die carrier and from the die carrier to a dedicated heatsink or a PCB to which the semiconductor package is coupled. It may be necessary to electrically insulate the die carrier from the heatsink or PCB without significantly increasing the thermal resistance of the thermal path. For this purpose, specific dielectric heat conductor parts may be arranged between the die carrier and the heatsink or PCB. However, such heat conductor parts may have a comparatively low mechanical robustness and may therefore be prone to take damage, e.g. to receive scratches during handling of the semiconductor package by the customer. Improved semiconductor packages as well as improved methods for fabricating semiconductor packages may help with solving these and other problems.

The problem on which the invention is based is solved by the features of the independent. Further advantageous examples are described in the dependent claims.

SUMMARY

Various aspects pertain to a semiconductor package, comprising: a carrier comprising a first side and an opposing second side, a semiconductor die arranged on the first side of the carrier, a heat conductor part arranged on the second side of the carrier, an encapsulation body encapsulating the semiconductor die, wherein the heat conductor part is exposed from the encapsulation body, and wherein the heat conductor part has a different material composition than the encapsulation body, and a scratch protection layer covering the heat conductor part, wherein the scratch protection layer has a hardness which is at least five times higher than a hardness of the heat conductor part.

Various aspects pertain to a method for fabricating a semiconductor package, wherein the method comprises: providing a carrier with a first side and an opposing second side, arranging a semiconductor die on the first side of the carrier, arranging a heat conductor part on the second side of the carrier, encapsulating the semiconductor die with an encapsulation body such that the heat conductor part is exposed from the encapsulation body, wherein the heat conductor part has a different material composition than the encapsulation body, and covering the heat conductor part with a scratch protection layer, wherein the scratch protection layer has a hardness which is at least five times higher than a hardness of the heat conductor part.

BRIEF DESCRIPTION OF THE DRAWINGS

The accompanying drawings illustrate examples and together with the description serve to explain principles of the disclosure. Other examples and many of the intended advantages of the disclosure will be readily appreciated in view of the following detailed description. The elements of the drawings are not necessarily to scale relative to each other. Identical reference numerals designate corresponding similar parts.

DETAILED DESCRIPTION

In the following detailed description, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration only.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the tests "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a semiconductor package described below may use various types of semiconductor dies or circuits incorporated in she semiconductor dies, among them AC/DC or DC/DC converter circuits, power MOS transistors, power Schottky diodes, JFETs (Junction Gate Field Effect Transistor), power bipolar transistors, logic integrated circuits, etc. The semiconductor die(s) may have contact pads (or electrodes) which allow electrical contact to be made with the integrated circuits included in the semiconductor die(s). The electrodes may be arranged all at only one main face of the semiconductor die(s) or at both main faces of the semiconductor die(s).

An efficient semiconductor package packages, as well as an improved method for fabricating semiconductor packages, may for example reduce material consumption, ohmic losses, chemical waste, etc. and may thus enable energy and/or resource savings. Improved semiconductor packages as well as improved methods for fabricating semiconductor packages, as specified in this description, may thus at least indirectly contribute to green technology solutions, i.e. climate-friendly solutions providing a mitigation of energy and/or resource use.

Figure 1:
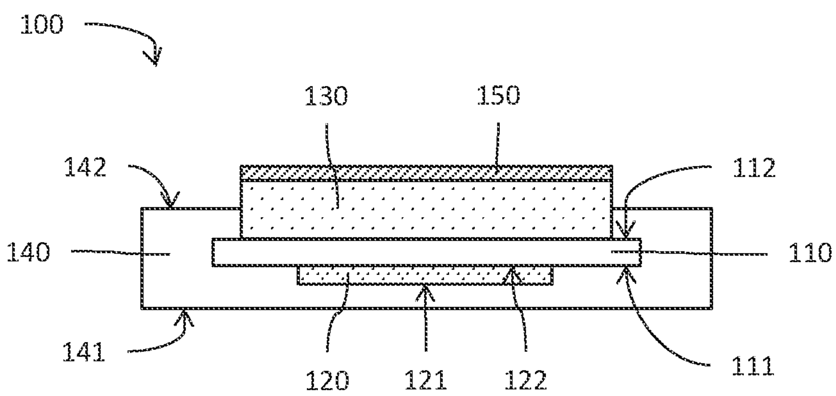
FIG. 1 shows a sectional view of a semiconductor package with a scratch protection layer arranged on a heat conductor part.

FIG. 1 shows a semiconductor package 100 comprising a carrier 110, a semiconductor die 120, a heat conductor part 130, an encapsulation body 140, and a scratch protection layer 150.

The carrier 110 comprises a first side 111 and an opposite second side 112, wherein the semiconductor die 120 is arranged on the first side 111 of the carrier 110 and the heat conductor part 130 is arranged on the second side 112.

The encapsulation body 140 encapsulates the semiconductor die 120 in such a way that the heat conductor part 130 is exposed from the encapsulation body 140. The heat conductor part 130 in particular has a different material composition than the encapsulation body 140.

The scratch protection layer 150 covers the heat conductor part 130, in particular an outer surface of the heat conductor part 130. Furthermore, the scratch protection layer 150 has a hardness which is at least five times higher than a hardness of the heat conductor part 130.

In this context, the term "hardness" may refer to scratch hardness which may for example be measured according to the Mohs scale, or it may refer to indentation hardness which may for example be measured according to the Rockwell, Vickers, Shore, or Brinell scale.

The semiconductor package 100 may e.g. be a power semiconductor package, configured to operate with a high voltage and/or a high electrical current. The semiconductor package 100 may be a through-hole device (THD), e.g. a package according to the TO247 specification, or it may be a surface-mount device (SMD).

The carrier 110 may be any suitable type of die carrier, e.g. a lead frame part, a printed circuit board (PCB), a direct copper bond (DCB), a direct aluminum bond (DAB), etc. The carrier 110 may e.g. comprise or consist of Al, Cu or Fe. The carrier 110 may be at least partially encapsulated by the encapsulation body 140. The carrier 110 may be configured to transfer heat away from the semiconductor die 120, towards the heat conductor part 130.

The semiconductor die 120 may be a power semiconductor die. The semiconductor die 120 may comprise a first side 121 facing away from the carrier 110 and an opposite second side 122 facing the carrier 110. The semiconductor die 120 may comprise a first power electrode (e.g. a source, drain, emitter or collector electrode) on its first side 121 and it may comprise a second power electrode on its second side 122. The second power electrode may be electrically coupled to the carrier 110, e.g. via a solder joint.

According to an example, the semiconductor package 100 comprises more than one semiconductor die 120, which may be identical dies or different types of dies. The additional die(s) may also be arranged on the die carrier 110 or on one or more additional die carriers. The semiconductor dies 120 may be electrically coupled to form a circuit, e.g. a half-bridge circuit, an inverter circuit, etc.

The heat conductor part 130 may be configured to be arranged on an external heatsink or a PCB and to allow a heat transfer from the carrier 110 to the heatsink or PCB. Furthermore, the heat conductor part 130 may be configured to electrically insulate the carrier 110 from the heatsink or PCB.

According to an example, the heat conductor part 130 comprises or consists of a silicone pad or an epoxy pad, or it comprises or consists of a pad of any other suitable dielectric material. Using such a pad instead of a layer of thermal grease may have several advantages. For example, the pad material may act as a "soft cushion" that gets compressed when the semiconductor package 100 is coupled to the heatsink or PCB. The compressed pad may provide a reduced thermal resistance compared to a layer of thermal grease. The heat conductor part 130 may in particular be a single contiguous component. (a "pad") and not a grease layer.

The heat conductor part 130 may comprise filler particles, in particular filler particles that are configured to improve the heat transfer capabilities of the heat conductor part 130. The filler particles may e.g. comprise or consist of one or more of AlO, BN, AlN and MgO. The heat conductor part 130 may have a content of filler particles of 50% or more, or 70% or more, or even 90% or more.

The heat conductor part 130 may for example have a thickness measured between a lower side facing the carrier 110 and an opposite upper side in the range of 2 μm to 50 μm, for example about 10 μm, about 20 μm, about 30 μm, or about 40 μm. The heat conductor part 130 may cover the second side 112 of the carrier 110 completely or partially, for example 50% or more, or 70% or more, or 90% or more of she second side 112 may be covered by the heat conductor part 130.

The encapsulation body 140 may have a first side 141 and an opposite second side 142, wherein the heat conductor part 130 is arranged at the second side 142. The heat conductor part 130 may protrude from the second side 142 as shown in the example of FIG. 1. The heat conductor part 130 may for example protrude by 10 μm or more, or 20 μm or more, or 30 μm or more (the protrusion is measured perpendicular so the second side 142).

The heat conductor part 130 and the second side 142 of the encapsulation body 140 may constitute a backside of the semiconductor package 100. The heat conductor part 130 may account for 30% or more, or 50% or more, or 70% or more, or 90% or more of the surface area of the backside.

According to an example, the heat conductor part 130 is arranged directly on the second side 112 of the carrier 110, without any intervening layers or components.

The encapsulation body 110 may for example be a molded body comprising or consisting of any suitable mold material. Compared to the heat conductor part 130, the encapsulation body 140 may be essentially incompressible. In particular, the molded body 140 may be dimensionally stable at art amount of pressure which is used to press a heatsink or PCB to the heat conductor part 130.

According to an example, the carrier 110 is partially exposed from the encapsulation body 140. For example, an external contact part of the carrier 110 may be exposed.

The scratch protection layer 150 may completely cover the upper side of the heat conductor part 130. The scratch protection layer 150 may have any suitable thickness, for example a thickness in the range of 0.2 μm to 20 μm, e.g. about 1 μm, about 5 μm, about 10 μm, or about 15 μm.

According to an example, the scratch protection layer 150 comprises inorganic material. A content of inorganic material of the scratch protection layer 150 may be relatively higher than a content of inorganic material of the heat conductor part 130. The inorganic material may be responsible for the hardness of the scratch protection layer 150. According to an example, the scratch protection layer 150 has a hardness of 68 MPa or even a hardness of 200 MPa. In comparison, the heat conductor part 130 may e.g. have a hardness of about 10 MPa.

According to an example, the scratch protection layer 150 comprises or consists of organic inorganic hybrid polymers.

Suitable organic-inorganic hybrid polymers are for example obtained from the so called ORMOCER compounds described in detail in DE 43 03 570 A1 and in DE 38 28 098 A1. These compounds may comprise silanes which may allow for a strong adhesion of the scratch protection layer 150 to the heat conductor part 130 (in particular in the case that the heat conductor part 130 comprises or consists of silicone).

Organic-inorganic hybrid polymers may be tailored to a variety of requirements. One particular such requirement is the fabrication of particularly thin but robust scratch protection layers. According to an example, the scratch protection layer 150 may therefore have such a small thickness that it essentially does not inhibit the heat transfer from the semiconductor die 120 to a heatsink or a PCB arranged above the heat conductor part 130.

Figure 2A:
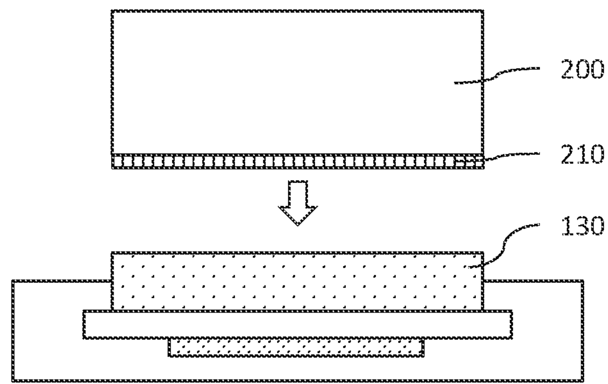
FIGS. 2A and 2B show two different exemplary methods for fabricating the scratch protection layer.
Figure 2B:
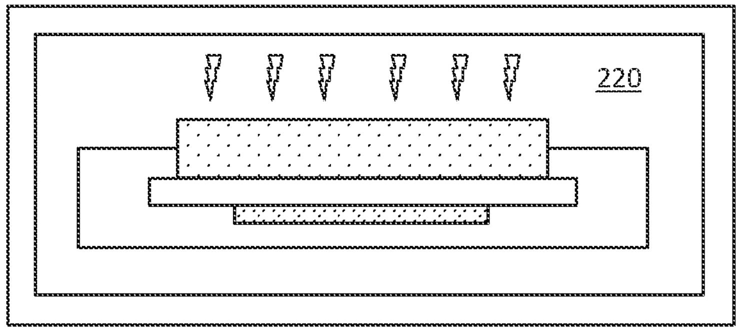

FIGS. 2A and 2B show two exemplary methods for applying the scratch protection layer 150 onto the heat conductor part 130.

As shown in FIG. 2A, a stamping equipment 200 may be used to transfer a liquid precursor 210 of the scratch protection layer 150 onto the upper side of the heat conductor part 130. The liquid precursor 210 may for example be an ORMOCER lacquer.

According to an example, the liquid precursor 210 is applied before the heat conductor part 130 has been cured completely. In other words, the heat conductor part 130 itself may still be semi-fluid when the liquid precursor 210 is applied. This may improve the adhesion between the scratch protection layer 150 and the heat conductor part 130. After the liquid precursor 210 has been applied, a common curing process may be performed to cure both the heat conductor part 130 and the liquid precursor 210 (thereby forming the scratch protection layer 150). According to another example, the liquid precursor 210 is applied after the heat conductor part 130 has already been cured.

Alternatively to the printing process shown in FIG. 2A, spray coating, dipping, jetting or any other suitable method may be used to apply the liquid precursor 210 to the heat conductor part 130.

FIG. 2B shows an alternative technique for fabricating the scratch protection layer 150. Instead of transferring some additional material onto the heat conductor part 130 and curing this additional material, the scratch protection layer 150 may instead be fabricated from the heat conductor part 130 itself. In particular, the upper side of the heat conductor part 130 may be exposed to a "rapid aging" treatment which may reduce the relative content of organic material and consequently increase the relative amount of inorganic (filler) material at the upper side. Such a treatment may for example comprise an exposure to heat, UV light and/or a plasma 220.

The conditions of the rapid aging treatment (e.g. the exposure time, temperature, electric field strength, etc.) may be chosen such that the scratch protection layer 150 is formed but at the same time damage to the semiconductor die 120, the carrier 110 and the encapsulation body 140 is avoided.

FIGS. 3A to 3F show a semiconductor package 300 in various stages of fabrication, according to an exemplary method for fabricating semiconductor packages. A similar method may be used for fabricating the semiconductor package 100. The semiconductor package 300 may be similar to the semiconductor package 100.

Figure 3A:
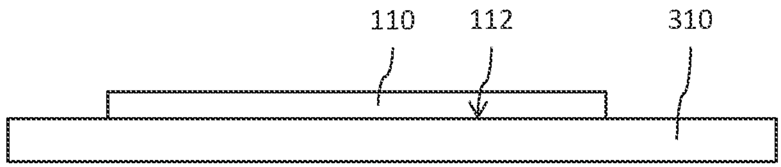
FIGS. 3A to 3F show a further semiconductor package comprising a scratch protection layer in various stages of fabrication, according to an exemplary method for fabricating semiconductor packages.

As shown in FIG. 3A, the carrier 110 is provided. The carrier 110 may for example be arranged on a temporary carrier 310, e.g. a tape, such that the second side 112 of the carrier 110 faces the temporary carrier 310.

Figure 3B:
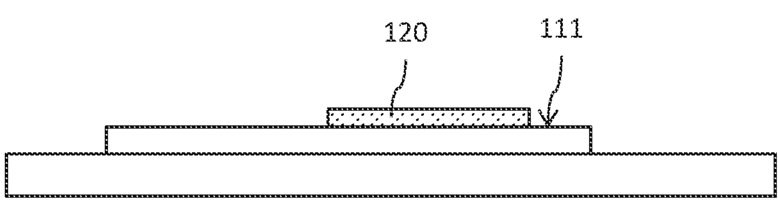

As shown in FIG. 3B, the semiconductor die 120 is arranged on the first side 111 of the carrier 110. This may also comprise electrically coupling the semiconductor die 120 to the carrier 110.

Figure 3C:
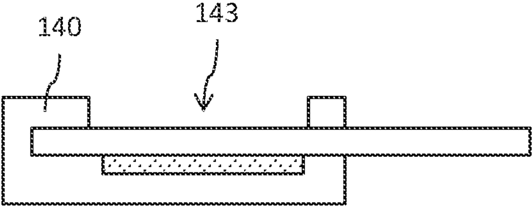

As shown in FIG. 3C, the semiconductor die 120 is encapsulated with the encapsulation body 140. The carrier 110 may also be at least partially encapsulated. The encapsulation body 140 may for example be a molded body, formed using a molding technique like e.g. transfer molding or compression molding.

The encapsulation body 140 may comprise an opening 143, wherein the carrier 110 is exposed from the encapsulation body 140 within the opening 143. The opening 143 may e.g. be fabricated during the molding process or it may be fabricated by removing material after the molding process.

Figure 3D:
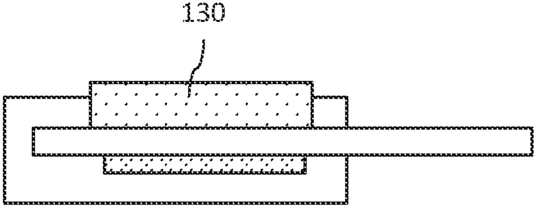

As shown in FIG. 3D, the heat conductor part 130 is arranged on the carrier 110. The heat conductor part 130 may in particular be arranged in the opening 143 and it may completely fill the opening 143. The heat conductor part 130 may protrude from the second side 142 of the encapsulation body 140.

Arranging the heat conductor part 130 on the carrier 110 may for example comprise applying a fluid precursor and curing the precursor to obtain the heat conductor part 130. Alternatively, the heat conductor part 130 may be deposited in cured form by a pick and place process.

The heat conductor part 130 may be arranged on the carrier 110 after the encapsulation body 140 has been formed, as shown in FIGS. 3C and 3D. However, according to another example it is also possible that the encapsulation body 140 is fabricated after the heat conductor part 130 has been formed.

Figure 3E:
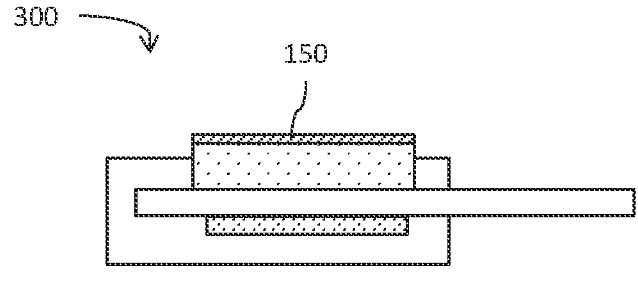

As shown in FIG. 3E, the heat conductor part 130, in particular its upper side, is covered with the scratch protection layer 150. This may comprise depositing a precursor as e.g. described with respect to FIG. 2A, or it may comprise aging the upper side of the heat conductor part 130 as described with respect to FIG. 2B.

The scratch protection layer 150 may be configured to protect the heat conductor part 130 from damage during further processing of the semiconductor package 300. Damage to the heat conductor part 130, e.g. a scratch, could entail that the carrier 110 is no longer properly electrically insulated.

Figure 3F:
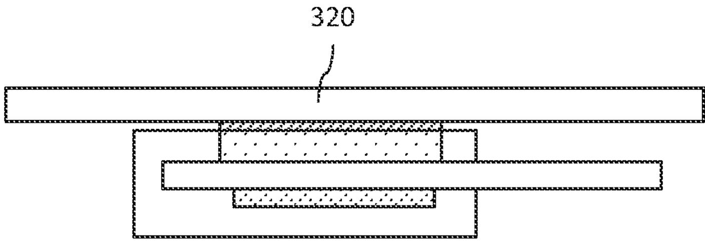

As shown in FIG. 3F, the semiconductor package 300 may be coupled to an external part 320, for example a heatsink or a PCB, such that the external part 320 is arranged on the scratch protection layer 150. Thereby, the heat conductor part 130 may get compressed such that it no longer protrudes from the encapsulation body 140. The compressed heat conductor part 130 and the relatively thin scratch protection layer 150 provide a thermal path with a low thermal resistance between the carrier 110 and the external part 320.

Figure 4:
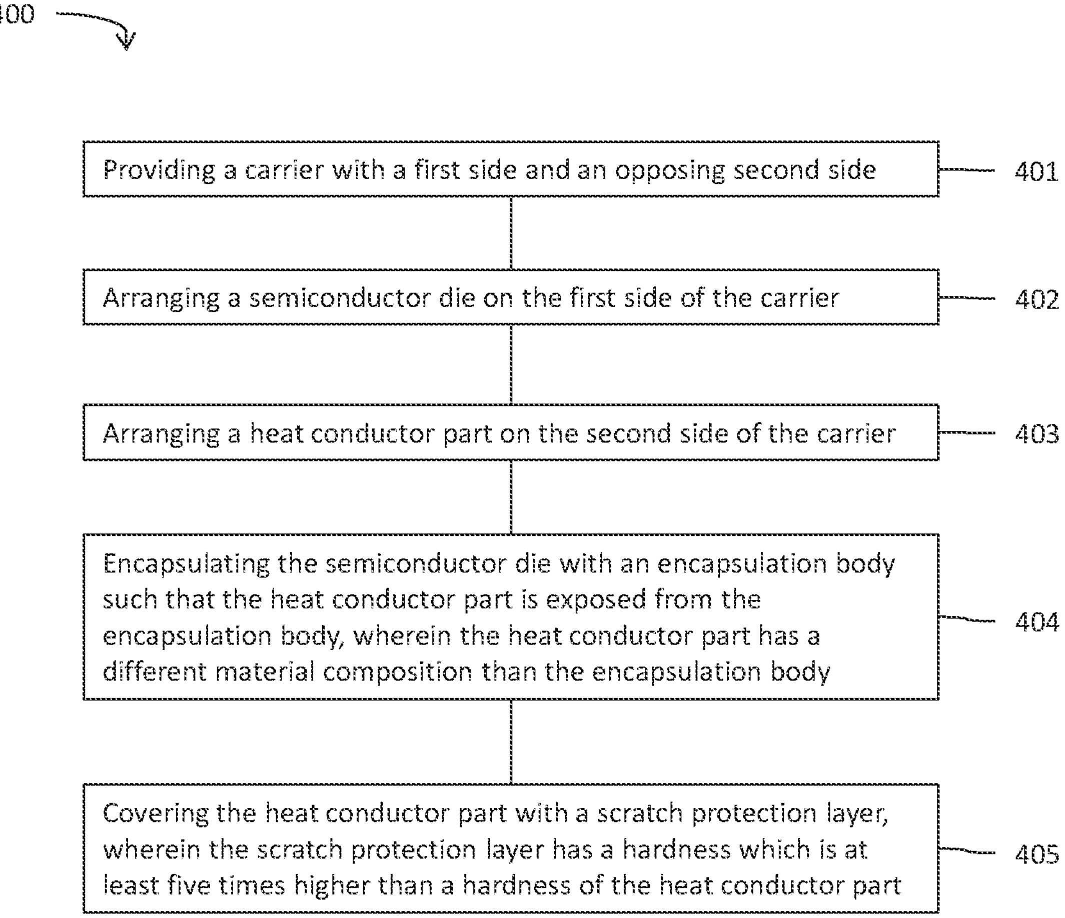
FIG. 4 is a flow chart of an exemplary method for fabricating semiconductor packages.

FIG. 4 is a flow chart of an exemplary method 400 for fabricating a semiconductor package. The method 400 may for example be used for fabricating the semiconductor packages 100 and 300.

Method 400 comprises at 401 an act of providing a carrier with a first side and an opposing second side, at 402 an act of arranging a semiconductor die on the first side of the carrier, at 403 an act of arranging a heat conductor part on the second side of the carrier, at 404 an act of encapsulating the semiconductor die with an encapsulation body such that the heat conductor part is exposed from the encapsulation body, wherein the heat conductor part has a different material composition than the encapsulation body, and at 405 an act of covering the heat conductor part with a scratch protection layer, wherein the scratch protection layer has a hardness which is at least five times higher than a hardness of the heat conductor part.

In the following, the semiconductor package as well as the method for fabricating a semiconductor package is further explained using specific examples.

Example 1 is a semiconductor package, comprising: a carrier comprising a first side and an opposing second side, a semiconductor die arranged on the first side of the carrier, a heat conductor part arranged on the second side of the carrier, an encapsulation body encapsulating the semiconductor die, wherein the heat conductor part is exposed from the encapsulation body, and wherein the heat conductor part has a different material composition than the encapsulation body, and a scratch protection layer covering the heat conductor part, wherein the scratch protection layer has a hardness which is at least five times higher than a hardness of the heat conductor part.

Example 2 is the semiconductor package of example 1, wherein the scratch protection layer has a relatively higher inorganic material content than the heat conductor part.

Example 3 is the semiconductor package of example 1 or 2, wherein the scratch protection layer comprises or consists of organic-inorganic hybrid polymers.

Example 4 is the semiconductor package of example 3, wherein the organic-inorganic hybrid polymers comprise one or more silanes.

Example 5 is the semiconductor package of one of the preceding examples, wherein the heat conductor part comprises or consists of a silicone pad.

Example 6 is the semiconductor package of one of the preceding examples, wherein the scratch protection layer has a thickness in the range of 0.2 μm to 20 μm.

Example 7 is the semiconductor package of one of the preceding examples, wherein the heat conductor part protrudes from art external surface of the encapsulation body.

Example 8 is the semiconductor package of one of the preceding examples, wherein the heat conductor part comprises filler particles configured to increase its thermal conductivity.

Example 9 is a method for fabricating a semiconductor package, wherein the method comprises: providing a carrier with a first side and an opposing second side, arranging a semiconductor die on the first side of the carrier, arranging a heat conductor part on the second side of the carrier, encapsulating the semiconductor die with an encapsulation body such that the heat conductor part is exposed from the encapsulation body, wherein the heat conductor part has a different material composition than the encapsulation body, and covering the heat conductor part with a scratch protection layer, wherein the scratch protection layer has a hardness which is at least five times higher than a hardness of the heat conductor part.

Example 10 is the method of example 9, wherein the covering comprises depositing an organic-inorganic hybrid polymer precursor on the heat conductor part.

Example 11 is the method of example 10, wherein the depositing comprises spray coating, dipping, printing or jetting the organic-inorganic hybrid polymer precursor onto the heat conductor part.

Example 12 is the method of example 10 or 11, further comprising: curing the organic-inorganic hybrid polymer precursor in order to form the scratch protection layer.

Example 13 is the method of one of examples 9 to 12, wherein the scratch protection layer has a relatively higher inorganic material content than the heat conductor part.

Example 14 is the method of example 9, wherein the covering comprises aging the heat conductor part to form the scratch protection layer.

Example 15 is the method of example 14, wherein the heat conductor part is aged by a heat application process or by a plasma application process.

Example 16 is an apparatus comprising means for performing the method according to anyone of examples 9 to 15.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A semiconductor package, comprising:
- a carrier comprising a first side and an opposing second side;
- a semiconductor die arranged on the first side of the carrier;
- a heat conductor part arranged on the second side of the carrier;
- an encapsulation body encapsulating the semiconductor die, wherein the heat conductor part is exposed from the encapsulation body, and wherein the heat conductor part has a different material composition than the encapsulation body; and
- a scratch protection layer covering the heat conductor part, wherein the scratch protection layer has a hardness which is at least five times higher than a hardness of the heat conductor part.

2. The semiconductor package of claim 1, wherein the scratch protection layer has a relatively higher inorganic material content than the heat conductor part.

3. The semiconductor package of claim 1, wherein the scratch protection layer comprises organic-inorganic hybrid polymers.

4. The semiconductor package of claim 3, wherein the organic-inorganic hybrid polymers comprise one or more silanes.

5. The semiconductor package of claim 1, wherein the heat conductor part comprises a silicone pad.

6. The semiconductor package of claim 1, wherein the scratch protection layer has a thickness in a range of 0.2 μm to 20 μm.

7. The semiconductor package of claim 1, wherein the heat conductor part protrudes from an external surface of the encapsulation body.

8. The semiconductor package of claim 1, wherein the heat conductor part comprises filler particles configured to increase the thermal conductivity of the heat conductor part.

9. A method for fabricating a semiconductor package, the method comprising:

providing a carrier with a first side and an opposing second side;

arranging a semiconductor die on the first side of the carrier;

arranging a heat conductor part on the second side of the carrier;

encapsulating the semiconductor die with an encapsulation body such that the heat conductor part is exposed from the encapsulation body, wherein the heat conductor part has a different material composition than the encapsulation body; and covering the heat conductor part with a scratch protection layer, wherein the scratch protection layer has a hardness which is at least five times higher than a hardness of the heat conductor part.

10. The method of claim 9, wherein the covering comprises depositing an organic-inorganic hybrid polymer precursor on the heat conductor part.

11. The method of claim 10, wherein the depositing comprises spray coating, dipping, printing or jetting the organic-inorganic hybrid polymer precursor onto the heat conductor part.

12. The method of claim 10, further comprising:

curing the organic-inorganic hybrid polymer precursor to form the scratch protection layer.

13. The method of claim 9, wherein the scratch protection layer has a relatively higher inorganic material content than the heat conductor part.

14. The method of claim 9, wherein the covering comprises aging the heat conductor part to form the scratch protection layer.

15. The method of claim 14, wherein the heat conductor part is aged by a heat application process or by a plasma application process.

* * * * *